(12) United States Patent
Shoga

(10) Patent No.: US 6,407,444 B1
(45) Date of Patent: Jun. 18, 2002

(54) SINGLE EVENT UPSET HARDENING OF A SEMICONDUCTOR DEVICE USING A BURIED ELECTRODE

(75) Inventor: Munir Shoga, Laguna Niguel, CA (US)

(73) Assignee: Hughes Electronics Corp., El SEgundo, CA (US)

( * ) Notice: Subject to any disclaimer, the term of this patent is extended or adjusted under 35 U.S.C. 154(b) by 0 days.

(21) Appl. No.: 09/619,543

(22) Filed: Jul. 19, 2000

(51) Int. Cl.[7] .............................................. H01L 29/40
(52) U.S. Cl. ...................................... 257/621; 257/618
(58) Field of Search ............................... 257/618, 621, 257/622–635, 345, 356, 357

(56) References Cited

U.S. PATENT DOCUMENTS

| 5,436,195 A | * | 7/1995 | Kimura et al. | ................ | 438/24 |
| 6,034,415 A | * | 3/2000 | Johnson et al. | ............. | 257/621 |
| 6,218,895 B1 | * | 4/2001 | De et al. | .................... | 327/566 |

FOREIGN PATENT DOCUMENTS

| JP | 62221157 A | * | 9/1987 | ................. | 257/428 |

* cited by examiner

Primary Examiner—Minh Loan Tran
Assistant Examiner—Thomas L Dickey
(74) Attorney, Agent, or Firm—John R. Rafter; Terje Gudmestad

(57) ABSTRACT

A semiconductor device includes a substrate such as indium phosphide having a trap density which increases with increasing distance from a top surface of the substrate, so that the electrical conductivity of the substrate increases with increasing distance from the top surface. An active device structure is built on the substrate and is disposed adjacent to the top surface of the substrate. A biasing structure has a buried electrode disposed below the top surface of the substrate a distance of from about 0.1 to about 2 micrometers, and an electrical contact at a surface of the substrate and in electrical communication with the buried electrode. A biasing source applies a biasing voltage of from about 0.2 volts to about 5 volts to the electrical contact. The biased subsurface contact protects the active device structure from current induced in the substrate by energetic particles and other radiation.

15 Claims, 2 Drawing Sheets

SINGLE EVENT UPSET HARDENING OF A SEMICONDUCTOR DEVICE USING A BURIED ELECTRODE

This invention relates to semiconductor devices, and more particularly, to the protection of such devices against single event upset damage caused by high-energy impacts on the devices.

BACKGROUND OF THE INVENTION

A semiconductor device may be susceptible to damage from various types of radiation and particles that impinge on the device. In one type of damage, electron-hole pairs are created when energetic particles, such as cosmic rays, alpha particles, and/or protons, are incident upon on the semiconductor device. The electrons or the holes may migrate as a current to the active device structure (e.g., a transistor) of the semiconductor device. This damage-induced current may be misinterpreted by the active device structure and cause it to perform improperly. The malfunction, termed a Single Event Upset (SEU), may lead to disruption of the electronic circuitry.

SEU damage is a particularly significant problem for semiconductor devices used in space applications. High-energy damage sources are plentiful. Protection by using thick, impenetrable cases is not possible due to their high weight. Alternative approaches are to provide for redundancy of the circuitry and to use complex error detection and correction techniques. The former increases the size of the semiconductor device and increases its power consumption. The latter adds cost and increases the computing time.

The present inventor is particularly concerned with high-speed heterojunction bipolar semiconductor device structures for use in space applications. One form of this technology is based on the use of indium phosphide-based semiconductor substrates. There is no known approach for hardening such devices against SEU damage.

Accordingly, there is a need for an improved approach to the prevention of SEU damage in semiconductor devices, particularly those of the indium phosphide type. This approach must be compatible with the operation of the semiconductor devices, and must not significantly increase the size and/or power consumption of the devices. The present invention fulfills this need, and further provides related advantages.

SUMMARY OF THE INVENTION

The present invention provides a semiconductor device having an active device structure, such as a transistor, with additional structure that reduces the susceptibility of the active device structure to damage from Single Event Upset (SEU). The features that impart the increased damage tolerance are buried within the substrate of the semiconductor device, except for an external electrical contact. They therefore occupy very little surface area of the semiconductor device, so that it remains compact. Substantially no additional power is consumed in achieving the protection of the active device structure.

In accordance with the invention, a semiconductor device comprises a substrate, an active device structure, such as a transistor having a collector, disposed adjacent to a top surface of the substrate, and a biasing structure. The biasing structure includes a buried electrode disposed below the top surface of the substrate, and an electrical contact at a surface of the substrate and in electrical communication with the buried electrode. The semiconductor device desirably further includes a biasing source having a voltage output which applies a biasing voltage to the electrical contact of greater than about 0.2 volts and typically greater than about 0.7 volts. The biasing voltage applied to the electrical contact is normally in the range of from about 0.2 volts to about 5 volts, most preferably from about 0.7 volts to about 5 volts.

The active device structure preferably includes a transistor having a collector. The buried electrode is preferably disposed below the top surface of the substrate by a distance of from about 0.1 micrometers to about 2 micrometers.

The substrate is preferably made of a material having a trap density which increases with increasing distance from a top surface of the substrate. That is, the electrical resistivity of the substrate decreases with increasing distance from the top surface. The substrate is therefore semi-insulating near the top surface, and semi-conducting at greater depths below the top surface. The preferred substrate material comprises indium phosphide (InP).

In one embodiment, the buried electrode extends perpendicular to the top surface of the substrate. In another embodiment, the buried electrode includes a first portion that extends perpendicular to the top surface of the substrate and a second portion, in electrical communication with the first portion, that extends parallel to the top surface of the substrate and at a distance of from about 0.1 to about 2 micrometers below the top surface of the substrate. Other operable structures for the buried electrode may also be used.

When high energy radiation or particles impact and penetrate the substrate, electrons and holes are produced. For example, when an energetic particle penetrates the substrate, a narrow column of charge is produced corresponding to the track of the column. In the absence of the present biasing structure, at least some of the charge deposited into the substrate migrates to the active device structure. The load capacitance of the active device structure is charged, inducing a voltage at the base of the load transistor. If sufficient voltage is established, the next transistor turns on, leading to a Single Event Upset (SEU) of the circuit.

The biased buried electrode of the present invention collects the migrating charge, preventing it from reaching the active device structure. The node voltage of the active device structure is prevented from dropping below the voltage (usually around 0.7 volts for an InP-based transistor) that will turn on the next-stage circuit, thereby preventing the SEU of the circuit. The actual value of the biasing voltage depends on the general semiconductor type and architecture, the nature of the active device structure, and its positioning within the circuit.

The present approach is implemented by depositing the metallic biasing structure in conjunction with the formation of the substrate of the semiconductor device. Little surface area of the semiconductor device is taken up by the biasing structure, so that the total area of the semiconductor device is not substantially enlarged. A single biasing structure may serve several active device structures having the same biasing requirement. The operation of the individual active device structures is not affected by the subsurface biasing voltage applied in the present SEU hardening approach, as the biasing voltage is localized and well below the active device structures.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
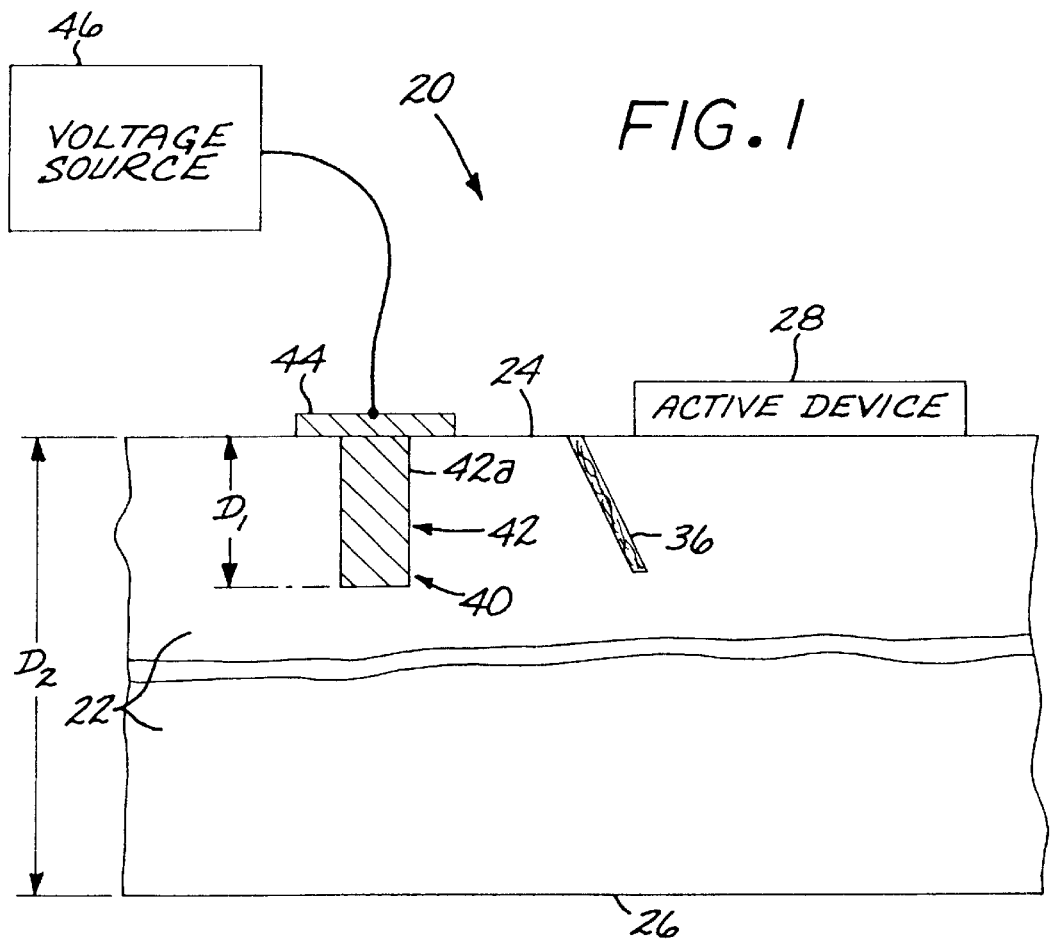
FIG. 1 is a schematic sectional view of a first semiconductor device utilizing the present approach.
Figure 3:
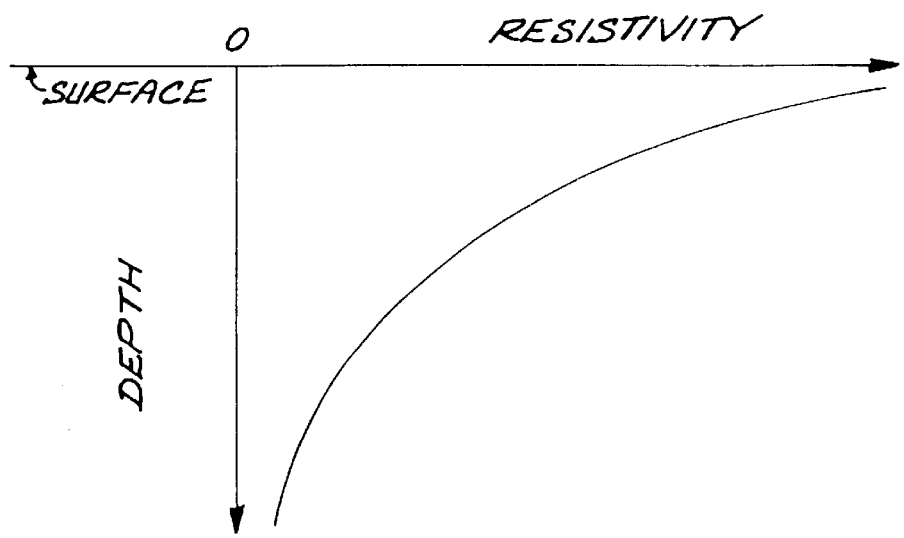
FIG. 3 is a schematic graph of resistivity of the substrate as a function of distance from the top surface.
Figure 2:
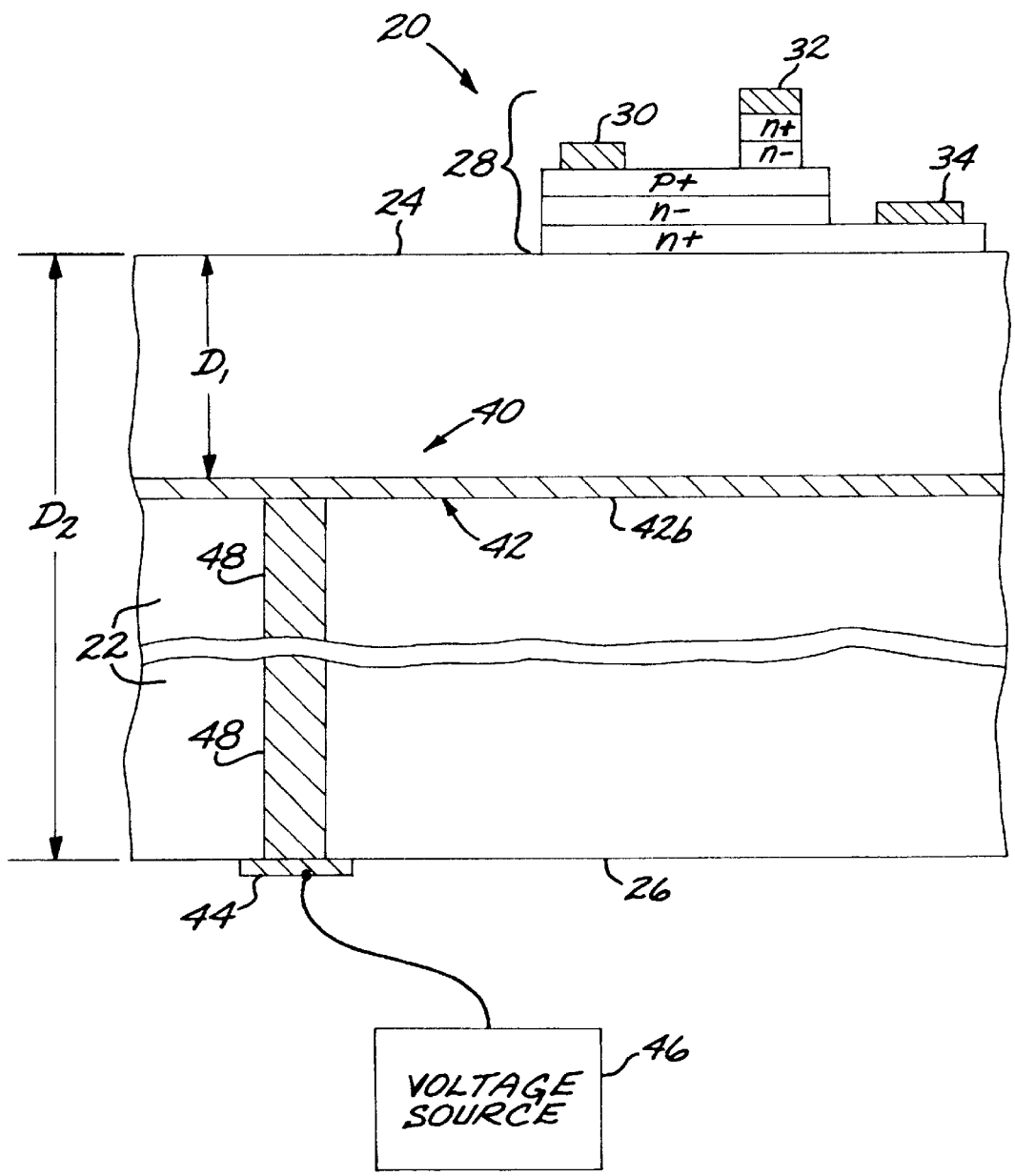
FIG. 2 is a schematic sectional view of a second semiconductor device utilizing the present approach.

FIGS. 1 and 2 illustrate semiconductor devices 20 utilizing the approach of the invention. The semiconductor device 20 includes a substrate 22 having a top surface 24 and a back surface 26. The substrate 22 is preferably made of a substrate material having a trap density which increases with increasing distance from the top surface 24 of the substrate 22. (The term "trap density" refers to features that trap and possibly recombine defects such as electrons and holes.) The electrical resistivity of the substrate 22 of such a material decreases with increasing distance from the top surface 24. FIG. 3 illustrates this variation. The substrate 22 is therefore semi-insulating near the top surface 24 and semi-conducting at greater depths below the top surface 24. The preferred substrate material comprises indium phosphide (InP). Indium phosphide technology is the basis for extremely high speed heterojunction bipolar devices.

An active device structure 28 is disposed adjacent to the top surface 22 of the substrate 24. The active device structure 28 may be on top of the top surface 22, as illustrated, or buried slightly below the top surface 22. The present invention is not concerned with the detailed structure of the devices themselves, and they are taken to be within the ordinary skill in the art for the present purposes. However, in a typical case shown schematically in FIG. 2, the active device 28 is a transistor with a base electrode 30, an emitter electrode 32, and a collector electrode 34. In such a device, the collector electrode 34 responds to voltage changes caused by electron flows produced by the other electrodes. If the voltage changes sensed at the collector electrode 34 are truly caused by the other electrodes, the active device structure 28 functions properly.

In other occasions, however, energetic particles such as cosmic rays (heavy ions), alpha particles, and/or protons may impinge upon the semiconductor device 20. Each one of the energetic particles produces a generally columnar track, indicated at numeral 36 in FIG. 1, through the substrate 22 as it decelerates. As energy is transferred from the decelerating particle to the substrate 22, electrons and holes are produced. The holes migrate by diffusion toward the active device structure 28, and in particular the collector electrode 34 in the event that the active device structure 28 is a transistor. (Some of the holes may be prevented from reaching the active device structure 28 by traps, but others may reach the active device structure 28.) Upon reaching the collector electrode 34, the migrating holes reduce the voltage at the collector electrode 34. If the voltage drop is sufficiently large, it may be so low that it is below the turn-on voltage for the following transistor (not shown), resulting in an incorrect change to the circuit, which is termed a Single Event Upset (SEU).

To harden the semiconductor device 20 against SEU, the semiconductor device 20 includes a biasing structure 40. The biasing structure 40 includes a metallic buried electrode 42 disposed below the top surface 24 of the substrate 22. The buried electrode 42 electrically communicates with an electrical contact 44 at a surface 24 or 26 of the substrate 22. The buried electrode 42 may be any operable material, including metals such as copper, gold, aluminum, tungsten, or chromium, for example.

A biasing voltage is applied to the electrical contact 44 by an output of a voltage biasing source 46 and hence to the buried electrode 42. The biasing voltage raises the potential substrate. The required magnitude of the biasing voltage depends on several factors, including at least the nature of the material, the nature of the active device 28, and the nature of the circuit of which the active device 28 is a part. Typically, however, the biasing voltage is from about 0.2 volts to about 5 volts, more preferably from about 0.7 volts to about 5 volts. If the biasing voltage is less than about 0.2 volts, it is ineffective. A zero (ground) voltage and a floating voltage are not operable because they will be ineffective. That is, a buried electrically grounded or floating electrode is not operable in the present invention. If the biasing voltage is less than about 0.7 volts, there is some risk of ineffectiveness. The biasing voltage is therefore preferably greater than about 0.7 volts. If the biasing voltage is greater than about 5 volts, the invention is operable but no additional benefits are obtained. Additionally, higher voltages may interfere with the operation of the active devices 28. If there are a number of active devices 28 that require various biasing voltages, the active devices requiring about the same biasing voltages would be physically grouped together so that they could be protected by a single buried electrode 42.

The buried electrode 42 may be of any operable form. The embodiment of FIG. 1 depicts a metallic pin 42a or filled metallic via extending generally (but not necessarily exactly) perpendicular to the surface 24 and downwardly into the substrate 22 to a depth $D_1$. The buried electrode 42 may have other shapes as well, such as a V-shape or other form that is not perpendicular to the surface 24. The embodiment of FIG. 2 includes a planar buried electrode 42b extending generally (but not necessarily exactly) parallel to the surface 24 at a depth $D_1$, with an electrical conductor 48 establishing the electrical communication between the buried electrode 42b and the electrical contact 44, and may also serve as a portion of the buried electrode. The buried electrode 42b would typically not be an entire plane, as might appear from the schematic sectional view of FIG. 2, but instead a trace or strip of relatively narrower width. The contact 44 may be on the top surface 24, as in FIG. 1, or on the back surface 26, as in FIG. 2. The contact 44 may be made quite small in area, on the order of about 2 square micrometers, so that its presence does not substantially increase the required surface area of the semiconductor device 20.

The thickness of the substrate 22 is $D_2$, which is typically on the order of about 300 to about 600 micrometers. The depth $D_1$, of the buried electrode 42 from the top surface 24 is from about 0.1 to about 2 micrometers, preferably about 0.5 micrometers, far less than the substrate thickness dimension $D_2$. If $D_1$ is substantially greater than about 2 micrometers, the buried electrode 42 is too deep to have the desired biasing effect and is ineffective. This point is made to distinguish the backplane ground planes and other conductors that are sometimes placed on the back surface 26 of these substrates 22 for other purposes. Such a backplane conductor is not within the scope of the invention, unless it meets the limitations on $D_1$, as discussed above.

The operation of the present invention was simulated using a three-dimensional microelectronic device simulation analytical approach. A transistor 28 biased to 5 volts ($V_{cc}$) showed a reduction in the collected charge at the collector electrode 34 when the buried electrode 42 was biased to 2.5 volts. That is, less charge resulting from particle impacts reached the collector electrode 34 to potentially cause SEU.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

What is claimed is:

1. A semiconductor device comprising:
   a substrate;
   an active device structure disposed adjacent to a top surface of the substrate, wherein the active device structure comprises a transistor having a collector; and
   a biasing structure, comprising:
      buried electrode disposed below the top surface of the substrate, and
      an electrical contact at a surface of the substrate and in electrical communication with the buried electrode.

2. The semiconductor device of claim 1, wherein the substrate comprises indium phosphide.

3. The semiconductor device of claim 1, wherein the buried electrode is disposed below the top surface of the substrate by a distance of from about 0.1 to about 2 micrometers.

4. The semiconductor device of claim 1, further including a biasing source having an output which applies a biasing voltage to the electrical contact.

5. The semiconductor device of claim 4, wherein the biasing voltage is greater than about 0.2 volts.

6. The semiconductor device of claim 4, wherein the biasing voltage is from about 0.7 volts to about 5 volts.

7. The semiconductor device of claim 1, wherein the buried electrode extends perpendicular to the top surface of the substrate.

8. The semiconductor device of claim 1, wherein the buried electrode includes a first portion that extends perpendicular to the top surface of the substrate and a second portion, in electrical communication with the first portion, that extends parallel to the top surface of the substrate and at a distance of from about 0.1 to about 2 micrometers below the top surface of the substrate.

9. A semiconductor device comprising:
   a substrate made of a substrate material;
   an active device structure built on the substrate and disposed adjacent to the top surface of the substrate, wherein the active device structure comprises a transistor having a collector;
   a biasing structure, comprising:
      a buried electrode disposed below the top surface of the substrate a distance of from about 0.1 to about 2 micrometers, and
      an electrical contact at a surface of the substrate and in electrical communication with the buried electrode; and
   a biasing source that applies a biasing voltage to the electrical contact.

10. The semiconductor device of claim 9, wherein the substrate comprises indium phosphide.

11. The semiconductor device of claim 9, wherein the biasing voltage is greater than about 0.2 volts.

12. The semiconductor device of claim 9, wherein the biasing voltage is from about 0.7 volts to about 5 volts.

13. The semiconductor device of claim 9, wherein the buried electrode extends perpendicular to the top surface of the substrate.

14. The semiconductor device of claim 9, wherein the buried electrode includes a first portion that extends perpendicular to the top surface of the substrate and a second portion, in electrical communication with the first portion, that extends parallel to the top surface of the substrate and at a distance of from about 0.1 to about 2 micrometers below the top surface of the substrate.

15. A semiconductor device comprising:
   an indium phosphide substrate;
   an active device structure built on the substrate and disposed adjacent to the top surface of the substrate, wherein the active device structure comprises a transistor having a collector;
   a biasing structure, comprising:
      a buried electrode disposed below the top surface of the substrate by a distance of from about 0.1 to about 2 micrometers, and
      an electrical contact at a surface of the substrate and in electrical communication with the buried electrode; and
   a biasing source that applies a biasing voltage of from about 0.2 volts to about 5 volts to the electrical contact.

\* \* \* \* \*